(12) United States Patent
Chen et al.

(10) Patent No.: US 7,833,853 B2
(45) Date of Patent: Nov. 16, 2010

(54) METHOD OF DEFINING GATE STRUCTURE HEIGHT FOR SEMICONDUCTOR DEVICES

(75) Inventors: Ryan Chia-Jen Chen, Chiayi (TW); Yih-Ann Lin, Jhudong Township, Hsinchu County (TW); Joseph Lin, Sijhih (TW); Jr Jung Lin, Wurih Township, Taichung County (TW); Yu Chao Lin, Rende Township, Tainan County (TW); Chao-Cheng Chen, Shin-Chu (TW); Kuo-Tai Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/339,483

(22) Filed: Dec. 19, 2008

(65) Prior Publication Data

US 2010/0068861 A1  Mar. 18, 2010

Related U.S. Application Data

(60) Provisional application No. 61/096,520, filed on Sep. 12, 2008.

(51) Int. Cl.
*H01L 21/28* (2006.01)
(52) U.S. Cl. .................. 438/197; 257/E21.176
(58) Field of Classification Search .......... 438/197; 257/E21.176, E29.134
See application file for complete search history.

(56) References Cited

U.S. PATENT DOCUMENTS

| | | | | |
|---|---|---|---|---|
| 6,979,610 | B2* | 12/2005 | Terahara et al. | 438/221 |
| 7,183,596 | B2* | 2/2007 | Wu et al. | 257/213 |
| 7,195,969 | B2* | 3/2007 | Chan et al. | 438/230 |
| 2006/0128111 | A1* | 6/2006 | Beintner et al. | 438/400 |
| 2007/0197009 | A1* | 8/2007 | Srivastava et al. | 438/583 |

OTHER PUBLICATIONS

Chinese Patent Office, Office Action dated Jun. 28, 2010, Application No. 200910169153.8, 4 pages.

* cited by examiner

*Primary Examiner*—W. David Coleman
*Assistant Examiner*—Daniel Shook
(74) *Attorney, Agent, or Firm*—Haynes and Boone, LLP

(57) ABSTRACT

Provided is a method of semiconductor fabrication including process steps allowing for defining and/or modifying a gate structure height during the fabrication process. The gate structure height may be modified (e.g., decreased) at one or more stages during the fabrication by etching a portion of a polysilicon layer included in the gate structure. The method includes forming a coating layer on the substrate and overlying the gate structure. The coating layer is etched back to expose a portion of the gate structure. The gate structure (e.g., polysilicon) is etched back to decrease the height of the gate structure.

20 Claims, 6 Drawing Sheets

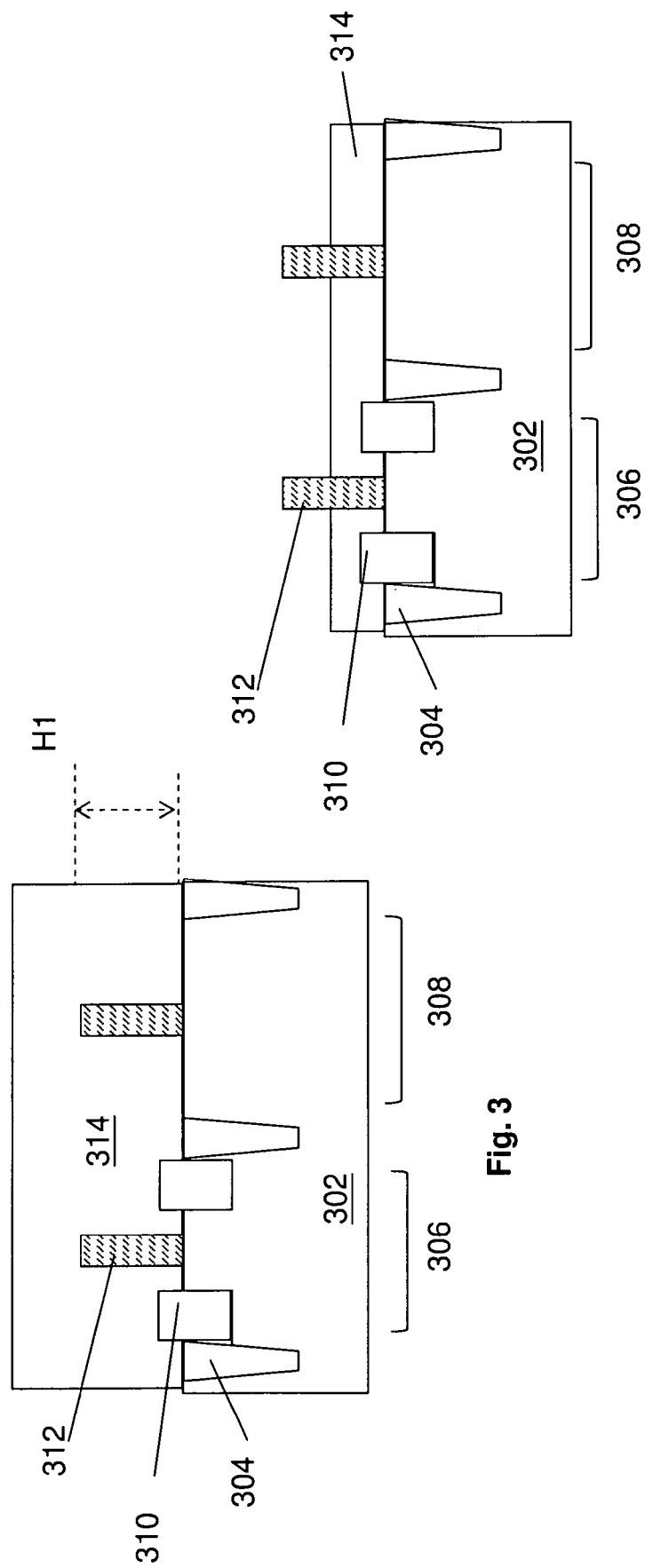

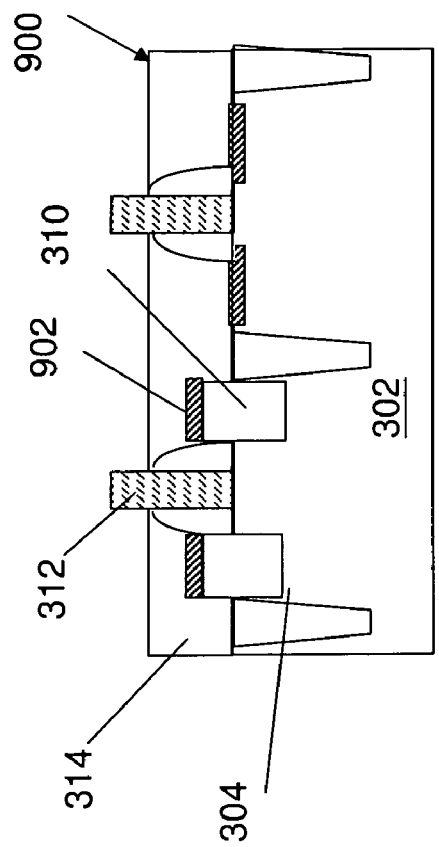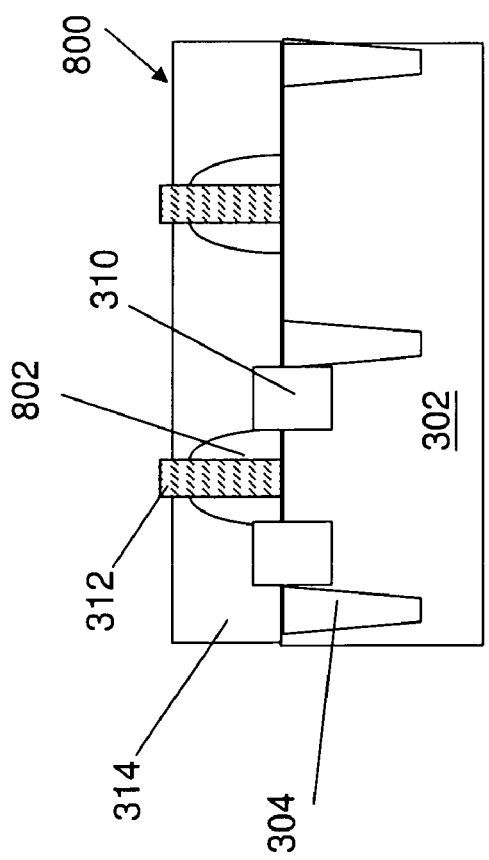

METHOD OF DEFINING GATE STRUCTURE HEIGHT FOR SEMICONDUCTOR DEVICES

PRIORITY DATA

This application claims priority to Provisional Application Ser. No. 61/096,520 filed on Sep. 12, 2008, entitled "Method of Defining Gate Structure Height For Semiconductor Devices," the entire disclosure of which is incorporated herein by reference.

BACKGROUND

The present disclosure relates generally to a semiconductor device such as, an integrated circuit or portion thereof and, more particularly, to a method of forming a gate structure of a semiconductor device.

As technology progresses, transistor gate height is decreasing. For example, a typical gate height for a 90 nm process may be approximately 150 nm. This is compared to an approximately 60 nm gate height for a typical 32 nm process. A gate height is generally defined during the deposition of a polysilicon layer (for example, in either polysilicon gate or metal gate technologies). However, when a reduced gate height is desired, there are several issues. Implant processes (such as implanting a low-dose drain (LDD) or pocket (halo) region) into the substrate adjacent the gate structure may be difficult if the gate height is too low. In contrast, if the gate height too high shadow effects may occur. For example, the impurities implanted may penetrate beneath the gate structure. Furthermore, a polysilicon etching time for decreasing the gate height may be very short, for example, less than 5 seconds. Such etching processes may be difficult to accurately control.

Therefore, what is needed is an improved method of forming a gate structure.

SUMMARY

In one embodiment, a method of fabricating a semiconductor device is provided. A gate structure is formed on a semiconductor substrate. The gate structure includes polysilicon. A coating layer is deposited on the substrate and the gate structure. The coating layer is etched back to expose a portion of the gate structure. The exposed gate structure is etched back includes etching polysilicon.

In another embodiment, a method of fabricating a semiconductor device is provided. A substrate is provided including a gate structure. The gate structure includes a polysilicon layer. A coating layer is formed on the substrate. The coating layer is etched to provide an exposed portion of the polysilicon layer of the gate structure. The exposed portion of the polysilicon layer is etched.

In yet another embodiment, a method of fabricating a semiconductor device including providing a substrate is illustrated. A dielectric layer is formed on the substrate. A gate layer is deposited on the dielectric layer. The dielectric and the gate layer are patterned to form a gate structure having a first height. A coating layer is formed on the substrate surrounding the gate structure. The thickness of the coating layer is reduced such that a top surface of the coating layer lies below a top surface of the gate structure. The gate structure is etched to form a second height. The second height is less than the first height.

BRIEF DESCRIPTION OF THE DRAWINGS

FIGS. 3-5 are cross-sectional views illustrating embodiments of a substrate according to the steps of the method of FIG. 2.

FIG. 8 is a cross-sectional view illustrating an embodiment of a substrate including a gate height reduction step after formation of spacer elements.

FIG. 9 is a cross-sectional view illustrating an embodiment of a substrate including a gate height reduction step after contact formation.

DETAILED DESCRIPTION

Figure 1:
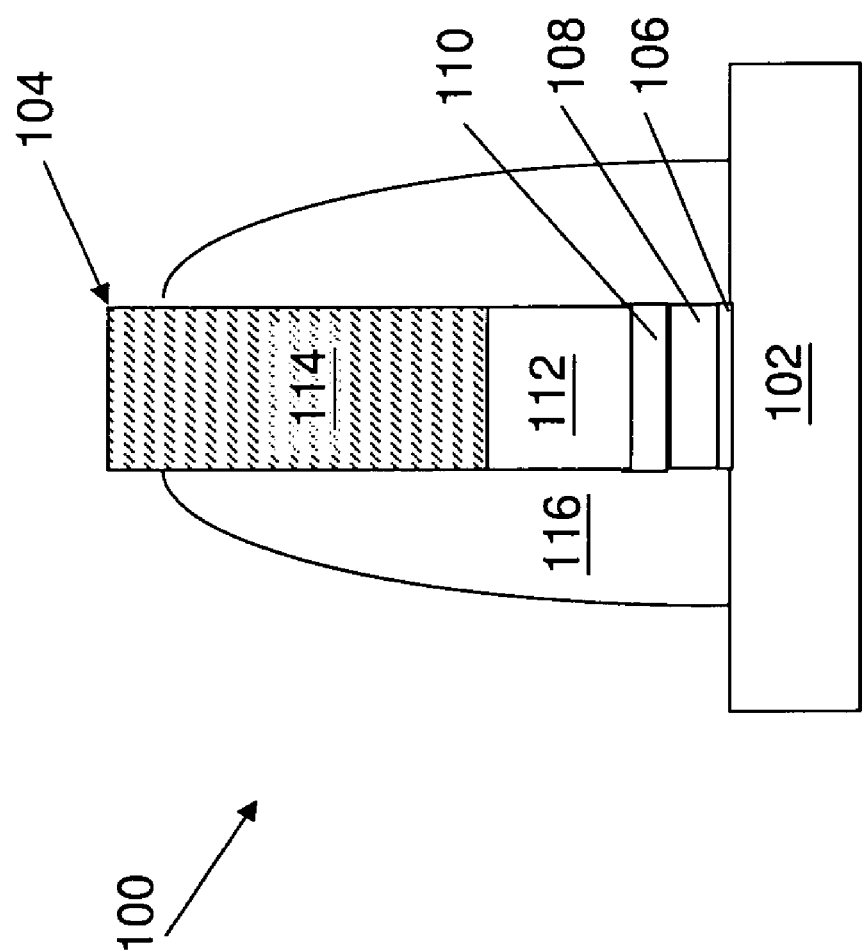
FIG. 1 is a cross-sectional view illustrating an embodiment of a metal gate structure.

The present disclosure relates generally to forming a semiconductor device on a substrate and, more particularly, to fabricating a gate structure of a semiconductor device (e.g., a gate of a FET device). It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, included are descriptions of a first layer or feature "on," "overlying," and like descriptions, a second layer or feature. These terms include embodiments where the first and second layer are in direct contact and those where one or more layers or feature are interposing the first and second layer. The embodiments described herein are detailed with respect to embodiments of polysilicon gate and/or a metal gate including polysilicon, however other embodiments are possible.

Referring to FIG. 1, illustrated is a semiconductor device 100. The device 100 includes a metal gate structure 104 formed on a substrate 102. The metal gate structure 104 includes an interface layer 106, a high-k dielectric layer 108, a capping layer 110, a metal layer 112, and a polysilicon layer 114. Spacer elements 116 are formed on the sidewalls of the metal gate structure 104.

In an embodiment, the substrate 102 includes a silicon substrate (e.g., wafer) in crystalline structure. Other examples of the substrate 102 may include other elementary semiconductors such as germanium and diamond. Alternatively, the substrate 102 may include a compound semiconductor such as, silicon carbide, gallium arsenide, indium arsenide, or indium phosphide. The substrate 102 may include various doping configurations depending on design requirements (e.g., p-type substrate or n-type substrate). Further, the substrate 102 may include an epitaxial layer (epi layer), may be strained for performance enhancement, and/or may include a silicon-on-insulator (SOI) structure.

The interface layer 106 may include silicon, nitrogen, oxygen, and/or other suitable components. In an embodiment, the interface layer 106 includes silicon oxide. The interface layer 106 may be formed using thermal oxidation, atomic layer deposition (ALD), and/or other suitable processes.

The high-k dielectric layer 108 may include a high-k material (e.g., relative to conventional silicon oxide dielectric layers). The high-k dielectric layer 108 may provide the gate dielectric layer of the gate structure 104. The gate dielectric layer 108 includes a high-k (high dielectric constant) material. In an embodiment, the high-k dielectric material includes hafnium oxide ($HfO_2$). Other examples of high-k dielectrics include hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. The high-k dielectric layer 108 may be formed using ALD, chemical vapor deposition (e.g., MOCVD), physical vapor deposition (PVD), and/or other suitable processes.

The capping layer 110 may include a metal oxide layer such as, $La_2O_3$, DyO, $Al_2O_3$, and/or other suitable compositions. In an embodiment, the capping layer 110 contributes to the work function of the gate structure 104.

The metal layer 112 may provide the metal gate electrode (e.g., work function) of the gate structure 104. The metal layer 112 may include one or more layers including Ti, TiN, TaN, Ta, TaC, TaSiN, W, WN, MoN, MoON, $RuO_2$, and/or other suitable materials. The metal layer 112 may include one or more layers formed by PVD, CVD, ALD, plating, and/or other suitable processes. Examples of metals that may be deposited include p-type metal materials and n-type metal materials. P-type metal materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

The polysilicon layer 114 is deposed on the metal layer 112. The polysilicon layer 114 may include polysilicon (e.g., doped or undoped). The polysilicon layer 114 may be formed using processes such as, CVD processes including plasma-enhanced CVD, low-pressure CVD, and/or other suitable processes. The gate structure 104 may be formed using one or more iterations of processes such as, photolithography to provide a masking element and etching using the masking element. Exemplary photolithography processes include, for example, deposition of photosensitive materials (e.g., photoresist), soft bake, exposure, and development. In an embodiment, a hard mask layer is used to pattern one or more layers of the gate structure 104.

The spacer elements 116 are formed on sidewalls of the gate structure 104. The spacer elements 116 may be formed of silicon oxide, silicon nitride, silicon oxynitride, silicon carbide, fluoride-doped silicate glass (FSG), a low-k dielectric material, and/or other suitable material. The spacer elements 116 may have a multiple layer structure, for example, including one or more liner layers. The liner layers may include a dielectric material such as silicon oxide, silicon nitride, and/or other suitable materials. The spacer elements 116 may be formed by methods including deposition of suitable dielectric material and etching the material to form the spacer element 116 profile.

Figure 2:
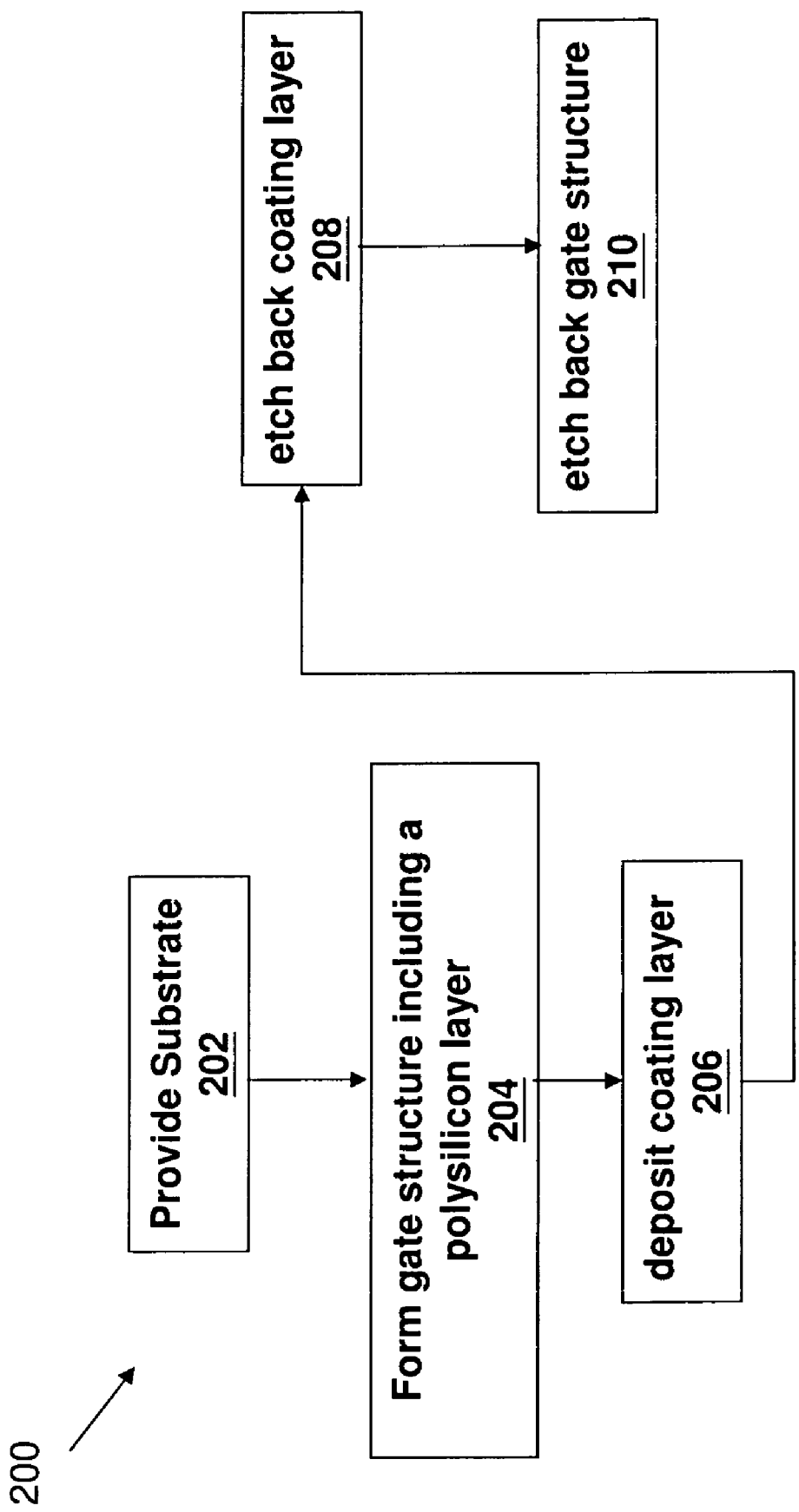
FIG. 2 is a flow chart illustrating an embodiment of a method of fabricating a gate structure.
Figure 5:
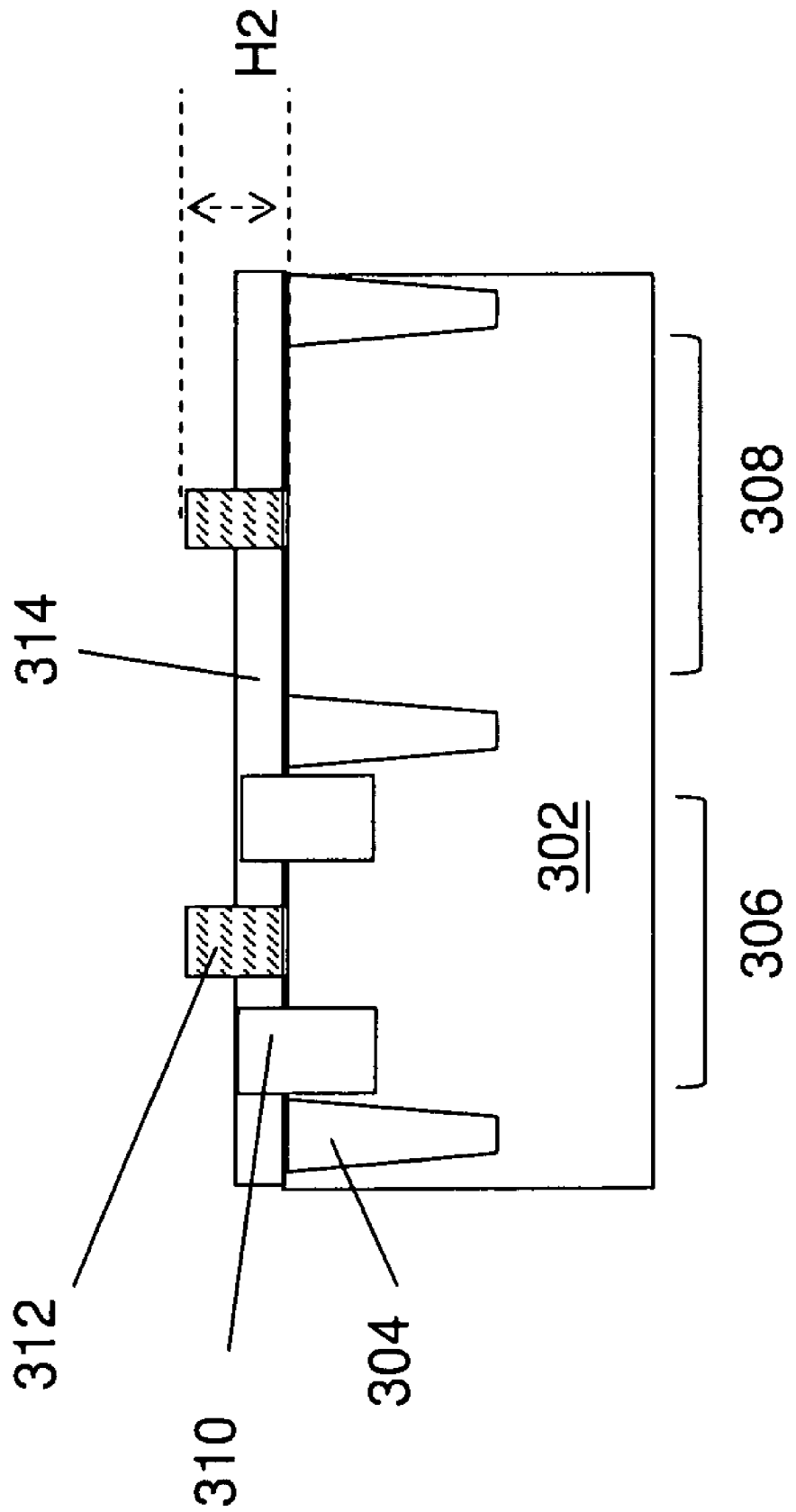

Referring now to FIG. 2, illustrated is a method 200 providing an embodiment of a method of fabricating a gate structure. FIGS. 3, 4, and 5 provide exemplary devices corresponding to steps of the method 200. The method 200 begins at step 202 where a substrate is provided. The substrate may be substantially similar to the substrate 102 described above with reference to FIG. 1. Referring to the example of FIG. 3, the substrate 302 is provided. The substrate 302 may be substantially similar to the substrate 102, described above with reference to FIG. 1. The substrate 302 includes a plurality of shallow trench isolation (STI) structures 304. The STI structures 304 define a first device region 306 and a second device region 308. The STI structures 304 may include silicon oxide, silicon nitride, silicon oxynitride, fluoride-doped silicate glass (FSG), and/or a low-k dielectric material. Other isolation methods and/or features are possible in lieu of or in addition to STI. The STI structures 304 may be formed using processes such as reactive ion etch (RIE) of the substrate 302 to form trenches, which are then filled with insulator material using deposition processes followed by a CMP process. In an embodiment, the first device region 306 is associated with a pMOS device. In an embodiment, the second device region is associated with an nMOS device. However, any configuration may be possible.

The substrate 302 also includes strained regions 310. The strained region 310 may provide for increased electron or hole mobility in the substrate 302. Thus, the regions 310 may improve performance of the device with which they are associated. In an embodiment, a strained region 310 is formed in a source/drain region of a device, for example, a PMOS device. The strained region 310 may include SiGe. The SiGe regions may be formed using epitaxial growth process. The strained region 310 is positioned adjacent to and a distance from a gate structure 312, described with reference to step 204 of the method 200. The strained regions 310 may be formed using sacrificial, dummy spacer elements to control the positioning of the strained region 310. In an embodiment, the strained regions 310 are omitted.

The method 200 then proceeds to step 204 where a gate structure including polysilicon is formed on the substrate. (Note that one or more features described above with reference to step 202 may be provided subsequent to the formation of the gate structure). The gate structure formed may include a polysilicon gate (e.g., a polysilicon gate electrode) or a metal gate structure (e.g., including a polysilicon layer overlying a metal work function layer). Referring to the example of FIG. 3, a gate structure 312 is formed. The gate structure 312 may be substantially similar to the gate structure 104, described above with reference to FIG. 1. The gate structure 312 includes a polysilicon layer. The polysilicon layer may be the top layer of the gate structure 312, or a hard mask layer may be positioned on the polysilicon layer. The gate structure 312 includes a thickness H1. The polysilicon layer may be approximately 800 Angstroms, by way of example and not intended to be limiting. In an embodiment, H1 is approximately 800 Angstroms. In an alternative embodiment, H1 is approximately 700 Angstroms.

The method 200 then proceeds to step 206 where a coating is formed on the substrate. The coating may be a layer of material blanket deposited on the substrate. The coating may include photoresist, an oxide (e.g., silicon oxide), and/or other suitable material. The coating includes a material that may be removed from the substrate. Referring to the example of FIG. 3, the coating layer 314 is provided on the substrate. The coating layer 314 may be formed by processes such as, chemical vapor deposition (CVD), spin-coating, and/or other suitable processes. In an embodiment, the coating layer 314 includes a photoresist (n-type or p-type). The coating layer 314 may be deposited by a spin-coating process.

The method 200 then proceeds to step 208 where the coating is etched. The step 208 may be described herein as an etch-back process of the coating. The etching process may include a wet etch and/or a dry etch process. In an embodiment, a dry etching process includes an $O_2$ and HBr etchant. The etching reduces the thickness of the coating layer. The etching may proceed until the coating includes a thickness that provides a portion of the gate structure, described above with reference to step 204, unprotected by the coating (e.g., exposed). The unprotected portion of the gate structure includes at least a portion of the polysilicon layer. In other terms, the coating is etched such that a top surface of the coating is below a top surface of the gate structure. Referring to the example of FIG. 4, the coating 312 has been etched back. A portion of the gate structures 312 are unprotected (e.g., extending from the coating layer).

The method 200 then proceeds to step 210 where the gate structure is etched. In particular, a polysilicon layer of the gate structure is etched. This step may be described herein as a polysilicon etch back process. The polysilicon etch back process may include a wet etch and/or a dry etch process. Example etchants includes $CF_4$, $CH_2F_2$, HBr, and/or other suitable etchants. The etchant used may be selective to the coating layer 314 such that the coating layer 314 is minimally etched during the polysilicon etch back process. In an embodiment, the step 208 and the step 210 are performed in-situ (e.g., within the same tool or chamber without transport of the substrate). Step 210 may include etching (e.g., removing) a hard mask layer overlying a polysilicon layer of the gate structure. Referring to the example of FIG. 5, the gate structure 312 has been etched, reducing in height. The gate structure 312 after etch back includes a height H2 which is less than the height H1 described above with reference to FIG. 3. In an embodiment, the height H2 is approximately 60 nanometers. In an alternative embodiment, the height H2 is approximately 50 nanometers. The embodiments of H2 provided are exemplary only (e.g., applicable to a 32 nm technology node), and any thickness is possible.

The method 200 may proceed to include steps such as, removing the coating layer, forming additional features such as, source/drain regions, spacer elements, contacts, interconnects, interlayer dielectric layers, and/or other suitable features.

The method 200 may be implemented at any point during the fabrication process. Moreover, the method 200, or portion thereof, may be implemented at a plurality of points during the fabrication process. As such, the height of the gate structure, and in particular the polysilicon layer of the gate structure may be modified (e.g., decreased) at numerous points in the process. Therefore, the fabrication process includes a defining a gate structure of multiple heights. Each height may be determined such that it is suitable for the associated process step. For example, the gate structure may include a first height when formed, a second height for spacer formation, a third height for contact formation, and so forth.

Therefore, provided is a method that allows for a polysilicon thickness to be modified through an etch back process after a gate structure, or portion thereof, has been formed. The polysilicon thickness can be modified by etching back the polysilicon layer of the gate structure, while protecting the remainder of the substrate from the etching. The desired gate structure height can be adjusted by adjusting the polysilicon layer of the gate structure thickness. The etch back process may be provided at various stages of a semiconductor device fabrication, for example, as described below with reference to FIGS. 6, 7, 8, and 9.

Several advantages of the method 200 may be apparent. The method provides a fabrication method that does not necessitate altering the polysilicon layer deposition process (e.g., recipe). Furthermore, etch process parameters of the polysilicon may be unmodified. The method 200 may provide for an enlarged gate etch process window. Further still, it allows for the gate height to be tuned for the specific device purpose. It allows the gate height to be reduced during the processes such that it may be tuned for the particular process step (e.g., preventing implant penetration). Other benefits may also be recognized, in addition or in lieu of the above mentioned.

Referring now to FIGS. 6, 7, 8, and 9, illustrated are exemplary embodiments including devices 600, 700, 800, and 900, respectively. The devices 600, 700, 800, and 900 illustrate semiconductor devices at various process stages in a semiconductor fabrication process. The devices 600, 700, 800, and 900 further illustrate process stages where the method 200, or a portion thereof, may be provided. That is, the devices 600, 700, 800, and 900 describe process stages where a modification of the gate structure height may occur. The illustration of devices 600, 700, 800, and 900 are exemplary only, and not intended to be limiting. The devices 600, 700, 800, and 900 illustrate a coating layer that has been etched back, such as described above with reference to steps 206 and 208 of the method 200. An etch back of the gate structures of devices 600, 700, 800, and 900 such as described with reference to step 210 of the method 200, may have been performed and/or may be a subsequent process step for the devices.

Figure 6:
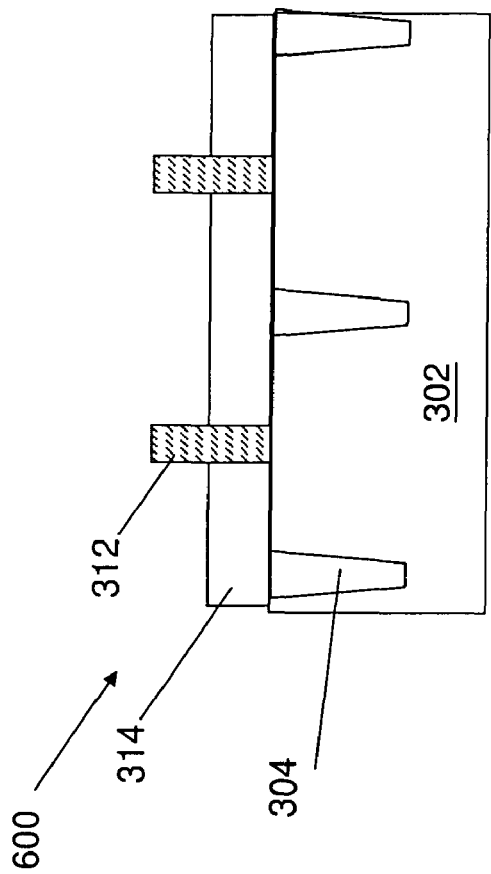
FIG. 6 is a cross-sectional view illustrating an embodiment of a substrate including a gate height reduction step after a gate structure formation.

The device 600, of FIG. 6, illustrates an etch back process performed at a process stage following the formation of a gate structure (e.g., after patterning the gate structure). The device 600 has completed etching (e.g., patterning) a polysilicon layer in the gate structure. Illustrated is the substrate 302, STI features 304, gate structure 312, and coating layer 314, described above with reference to FIGS. 3, 4, and/or 5. The coating layer 314 has been etched back to expose a portion of the gate structure 312.

Figure 7:
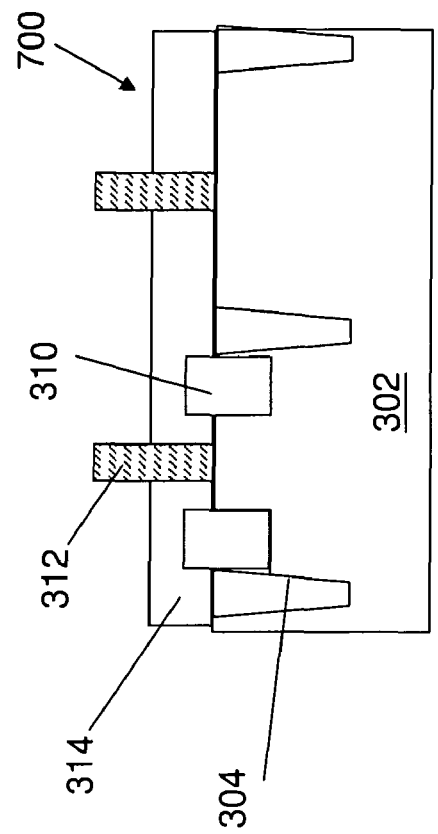
FIG. 7 is a cross-sectional view illustrating an embodiment of a substrate including a gate height reduction step after formation of strained regions.

The device 700, of FIG. 7, illustrates an etch back process performed at a process stage following the formation of strained regions on the substrate. The has completed process stages including etching (patterning) of the gate structure and the formation of strained regions adjacent one or more of the gate structures. Illustrated is the substrate 302, STI features 304, gate structure 312, strained regions 310, and coating layer 314, described above with reference to FIGS. 3, 4, and/or 5. The coating layer 314 has been etched back to expose a portion of the gate structure 312. The strained regions 310 underlie the coating layer 314.

The device 800, of FIG. 8, illustrates an etch back process performed at a process stage following the formation of spacer elements. The device 800 may have completed process stages including etching (patterning) of the gate structure and formation of spacer elements adjacent the gate structure. Illustrated is the substrate 302, STI features 304, gate structure 312, strained regions 310, spacer elements 802, and coating layer 314, described above with reference to FIGS. 3, 4, and/or 5. The spacer elements 802 may be substantially similar to the spacer elements 116, described above with reference to FIG. 1. The coating layer 314 has been etched back to expose a portion of the gate structure 312. In an embodiment, the substrate 302 includes a LDD and/or pocket implanted region (e.g., formed prior to the deposition of the coating layer 314 and subsequent etch back processes).

The device 900, of FIG. 9, illustrates an etch back process performed at a process stage following the formation of contacts on the substrate. The device 900 may have completed processes stages including etching (patterning) of the gate structure, formation of source/drain regions, and the formation of contact features. Illustrated is the substrate 302, STI features 304, gate structure 312, strained regions 310, contacts 902, and coating layer 314, described above with reference to FIGS. 3, 4, and/or 5. The coating layer 314 has been etched back to expose a portion of the gate structure 312. The contacts 902 may provide electrical connection to a source/drain region formed on the substrate 302. The contacts 902 may include nickel silicide, cobalt silicide, tungsten silicide, tantalum silicide, titanium silicide, platinum silicide, erbium silicide, palladium silicide, or combinations thereof. The contacts 902 may be formed on the source/drain regions by a salicide (self-aligned silicide) process. The source/drain regions may be formed by implanting p-type or n-type dopants or impurities into the substrate 302 depending on the desired transistor configuration. The source/drain features may be formed by methods including photolithography, ion implantation, diffusion, and/or other suitable processes. In an embodiment, the source/drain features of a device are formed in a strained region such as, the strained region 310.

Other process stages where an etch back process of a gate structure occur include after a LDD implant (e.g., prior to spacer formation), after a source/drain implant (e.g., prior to contact formation), and/or various other process stages.

The devices 600, 700, 800, and 900 illustrate that the height of a gate structure may be modified (e.g., decreased) at a plurality of stages during fabrication of a semiconductor device. In an embodiment, the gate structure height of a device may be modified at two or more of these stages during fabrication.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of fabricating a semiconductor device, comprising:
    forming a metal gate structure on a semiconductor substrate, wherein the gate structure includes polysilicon;
    depositing a coating layer on the substrate and the metal gate structure, wherein the coating layer includes photoresist;
    etching back the coating layer to expose a portion of the gate structure such that a top surface of the coating layer is below a top surface of the gate structure; and
    etching back the exposed gate structure, wherein the etching back the exposed gate structure includes etching polysilicon.

2. A method of fabricating a semiconductor device, comprising:
    providing a substrate including a gate structure and an isolation feature, wherein the gate structure includes a polysilicon layer;
    forming spacer elements adjacent the gate structure prior to forming a coating layer;
    forming the coating layer on the substrate including on the spacer elements, the gate structure, and the isolation feature;
    etching the coating layer to provide an exposed portion of the polysilicon layer of the gate structure such that a top surface of the coating layer is below a top surface of the gate structure and wherein the etched coating layer remains over the isolation feature; and
    etching the exposed portion of the polysilicon layer.

3. A method of fabricating a semiconductor device, comprising:
    providing a substrate;
    depositing a dielectric layer on the substrate;
    depositing a gate layer on the dielectric layer;
    patterning the dielectric and the gate layer to form a gate structure having a first height;
    forming a coating layer on the substrate above and along sides of the gate structure;
    reducing the thickness of the coating layer such that a top surface of the coating layer lies at least approximately 100 Angstroms below a top surface of the gate structure; and
    etching the gate structure, wherein the etching the gate structure forms a second height, wherein the second height is less than the first height, and wherein the coating layer protects the remainder of the substrate during the etching the gate structure.

4. The method of claim 1, wherein the forming the metal gate structure includes:
    forming a high-k dielectric layer;
    forming a metal layer on the high-k dielectric layer, wherein the metal layer provides a work function of the metal gate structure; and
    forming a polysilicon layer on the metal layer.

5. The method of claim 1, wherein the etching polysilicon provides for a decreased gate height.

6. The method of claim 1, wherein the etching polysilicon includes using an etchant selected from the group consisting of $CF_4$, $CH_2F_2$, and HBr.

7. The method of claim 1, further comprising:
    completely removing the coating layer from the substrate after the etching back of the exposed gate structure.

8. The method of claim 1, wherein after the etching back of the coating layer the coating layer remains on the substrate in all regions not having a gate structure.

9. The method of claim 4, wherein the etching back the exposed gate structure and etching back the coating layer are performed in-situ.

10. The method of claim 2, further comprising:
    forming a strained region adjacent the gate structure prior to forming the coating layer, wherein during the etching the exposed portion of the polysilicon layer, the strained region is protected by the coating layer.

11. The method of claim 2, further comprising:
    forming a contact prior to forming the coating layer.

12. The method of claim 2, further comprising:
    implanting a source or drain region prior to forming the coating layer, wherein the coating layer protects the source or drain region during the etching the exposed portion of the polysilicon layer.

13. The method of claim 2, further comprising:
    forming the gate structure, wherein the forming the gate structure includes:
    depositing a high-k dielectric layer;
    forming a metal gate electrode on the high-k dielectric layer; and
    forming the polysilicon layer on the metal gate electrode.

14. The method of claim 3, wherein etching the gate structure includes etching at least approximately 100 Angstroms of polysilicon.

15. The method of claim 3, wherein the first height is approximately 800 Angstroms.

16. The method of claim 3, wherein the second height is less than 600 Angstroms.

17. The method of claim 3, wherein the gate structure is a high-k metal gate structure.

18. The method of claim 3, wherein reducing the thickness of the coating layer includes a dry etch process.

19. The method of claim 3, further comprising:

performing a process to further reduce the thickness of the coating layer such that a top surface of the coating layer lies below a top surface of the gate structure having the second height; and thereafter, etching the gate structure, wherein the etching the gate structure forms a third height, wherein the third height is less than the second height.

20. The method of claim 3, further comprising:

forming a plurality of spacer elements on the substrate adjacent the gate structure of the first height prior to forming the coating layer; and implanting a source/drain feature on the substrate after forming the plurality of spacers and prior to forming the coating layer.

* * * * *